(12) United States Patent
Flautner et al.

(10) Patent No.: US 7,650,551 B2
(45) Date of Patent: *Jan. 19, 2010

(54) ERROR DETECTION AND RECOVERY WITHIN PROCESSING STAGES OF AN INTEGRATED CIRCUIT

(75) Inventors: Krisztian Flautner, Cambridge (GB); Todd Michael Austin, Ann Arbor, MI (US); David Theodore Blaauw, Ann Arbor, MI (US); Trevor Nigel Mudge, Ann Arbor, MI (US)

(73) Assignees: ARM Limited, Cambridge (GB); University of Michigan, Ann Arbor, MI (US)

( * ) Notice: Subject to any disclaimer, the term of this patent is extended or adjusted under 35 U.S.C. 154(b) by 140 days.

This patent is subject to a terminal disclaimer.

(21) Appl. No.: 11/889,759

(22) Filed: Aug. 16, 2007

(65) Prior Publication Data

US 2007/0288798 A1   Dec. 13, 2007

Related U.S. Application Data

(63) Continuation of application No. 10/392,382, filed on Mar. 20, 2003, now Pat. No. 7,278,080.

(51) Int. Cl.
  *G01R 31/28* (2006.01)
  *G11C 29/00* (2006.01)
(52) U.S. Cl. .................. 714/731; 714/710; 714/724
(58) Field of Classification Search ............ 714/710, 714/724, 731
See application file for complete search history.

(56) References Cited

U.S. PATENT DOCUMENTS 3,893,070 A    7/1975   Bossen et al.

3,905,023 A  *  9/1975   Perpiglia ................ 714/6

(Continued)

FOREIGN PATENT DOCUMENTS

EP         0 366 331         5/1990

(Continued)

OTHER PUBLICATIONS

N. Kanekawa et al, "Fault Detection and Recovery Coverage Improvement by Clock Synchronized Suplicated Systems with Optimal Time Diversity" *Fault-Tolerant Computing*, Jun. 1998, pp. 196-200.

(Continued)

*Primary Examiner*—Cynthia Britt
(74) *Attorney, Agent, or Firm*—Nixon & Vanderhye P.C.

(57) ABSTRACT

An integrated circuit includes a plurality of processing stages each including processing logic 2, a non-delayed latch 4, a delayed latch 8 and a comparator 6. The non-delayed latch 4 captures an output from the processing logic 2 at a non-delayed capture time. At a later delayed capture time, the delayed latch 8 also captures a value from the processing logic 2. The comparator 6 compares these values and if they are not equal this indicates that the non-delayed value was captured too soon and should be replaced by the delayed value. The non-delayed value is passed to the subsequent processing stage immediately following its capture and accordingly error recovery mechanisms are used to suppress the erroneous processing which has occurred by the subsequent processing stages, such as gating the clock and allowing the correct signal values to propagate through the subsequent processing logic before restarting the clock. The operating parameters of the integrated circuit, such as the clock frequency, the operating voltage, the body biased voltage, temperature and the like are adjusted so as to maintain a finite non-zero error rate in a manner that increases overall performance.

46 Claims, 5 Drawing Sheets

U.S. PATENT DOCUMENTS

| | | | |
|---|---|---|---|
| 4,339,657 A | 7/1982 | Larson et al. |
| 4,633,465 A | 12/1986 | Fitch et al. |
| 4,669,092 A | 5/1987 | Sari et al. |
| 4,756,005 A | 7/1988 | Shedd |
| 4,918,709 A | 4/1990 | Fitch |
| 4,975,930 A | 12/1990 | Shaw |
| 5,043,990 A | 8/1991 | Doi et al. |
| 5,203,003 A | 4/1993 | Donner |
| 5,276,690 A | 1/1994 | Lee et al. |
| 5,291,496 A | 3/1994 | Andaleon et al. |
| 5,313,625 A | 5/1994 | Hess et al. |
| 5,321,705 A | 6/1994 | Gould et al. |
| 5,400,370 A | 3/1995 | Guo |
| 5,402,273 A | 3/1995 | Tucker |
| 5,408,200 A | 4/1995 | Buhler |
| 5,426,746 A | 6/1995 | Sekiguchi |
| 5,455,536 A | 10/1995 | Kono et al. |
| 5,463,351 A | 10/1995 | Marko et al. |
| 5,504,859 A | 4/1996 | Gustafson et al. |
| 5,528,637 A | 6/1996 | Sevenhans et al. |
| 5,553,232 A | 9/1996 | Wilhite et al. |
| 5,572,662 A | 11/1996 | Ohta et al. |
| 5,615,263 A | 3/1997 | Takahashi |
| 5,625,652 A | 4/1997 | Petranovich |
| 5,627,412 A | 5/1997 | Beard |
| 5,737,369 A | 4/1998 | Retzer |
| 5,859,551 A | 1/1999 | Ohishi et al. |
| 5,870,446 A | 2/1999 | McMahan et al. |
| 5,914,903 A | 6/1999 | Kanma et al. |
| 6,067,256 A | 5/2000 | Yamashita et al. |
| 6,114,880 A | 9/2000 | Buer et al. |
| 6,167,526 A | 12/2000 | Carlson |
| 6,173,423 B1 | 1/2001 | Autechaud et al. |
| 6,188,610 B1 | 2/2001 | Kakizoe et al. |
| 6,222,660 B1 | 4/2001 | Traa |
| 6,476,643 B2 | 11/2002 | Hugues et al. |
| 6,523,201 B1 | 2/2003 | De Michele |
| 6,693,985 B2 | 2/2004 | Li et al. |
| 6,741,110 B2 | 5/2004 | Roisen |
| 6,772,388 B2 | 8/2004 | Cooper et al. |
| 6,799,292 B2 | 9/2004 | Takeoka et al. |
| 6,834,367 B2 | 12/2004 | Bonneau et al. |
| 6,907,553 B2 | 6/2005 | Popplewell et al. |
| 6,944,468 B2 | 9/2005 | Okumura |
| 6,958,627 B2 | 10/2005 | Singh |
| 6,977,910 B1 | 12/2005 | Hosur et al. |
| 7,010,074 B2 | 3/2006 | Nakamura |
| 7,046,056 B2 | 5/2006 | Kizer et al. |
| 7,085,993 B2 | 8/2006 | Goodnow et al. |
| 7,096,137 B2 | 8/2006 | Shipton et al. |
| 7,116,744 B2 | 10/2006 | Saze et al. |
| 7,142,623 B2 | 11/2006 | Sorna |
| 7,162,661 B2 * | 1/2007 | Mudge et al. ................. 714/10 |
| 7,278,080 B2 * | 10/2007 | Flautner et al. ............. 714/746 |
| 7,337,356 B2 * | 2/2008 | Mudge et al. ................ 714/10 |
| 7,401,273 B2 * | 7/2008 | Lee et al. .................... 714/724 |
| 2001/0016927 A1 | 8/2001 | Poisner |
| 2002/0038418 A1 | 3/2002 | Shimamura |

FOREIGN PATENT DOCUMENTS

| | | |
|---|---|---|
| EP | 0 374 420 | 6/1990 |
| EP | 0 653 708 | 5/1995 |
| JP | 60-20398 | 2/1985 |
| JP | 62-24498 | 2/1987 |
| JP | 2001175542 A * | 6/2001 |
| SU | 809350 | 2/1981 |
| WO | WO 00/54410 | 9/2000 |
| WO | WO 01/46800 | 6/2001 |
| WO | WO 2004/084072 | 9/2004 |

OTHER PUBLICATIONS

"ARM710 Data Sheet" Dec. 1994, Advanced RISC Machines Ltd. (ARM).

F. Worm et al, "An Adaptive Low-Power Transmission Scheme for On-Chip Networks" *ISSS'02*, Oct. 2002, pp. 92-100.

* cited by examiner

ERROR DETECTION AND RECOVERY WITHIN PROCESSING STAGES OF AN INTEGRATED CIRCUIT

This application is a Continuation of application Ser. No. 10/392,382, filed Mar. 20, 2003, now U.S. Pat. No. 7,278,080 the entire content of which is incorporated herein by reference.

BACKGROUND OF THE INVENTION

1. Field of the Invention

This invention relates to the field of integrated circuits. More particularly, this invention relates to the detection of processing errors and the recovery from such processing errors within processing stages of an integrated circuit.

2. Description of the Prior Art

It is known to provide integrated circuits that can be considered to be formed of a series of serially connected processing stages (e.g. a pipelined circuit). Between each of the stages is a latch into which one or more signal values are stored. The processing logic of each processing stage is responsive to input values received from preceding processing stages or elsewhere to generate output signal values to be stored in an associated output latch. The time taken for the processing logic to complete its processing operations determines the speed at which the integrated circuit may operate. If the processing logic of all stages is able to complete its processing operation in a short period of time, then the signal values may be rapidly advanced through the output latches resulting in high speed processing. The system cannot advance signals between stages more rapidly than the slowest processing logic is able to perform its processing operation of receiving input signals and generating appropriate output signals. This limits the maximum performance of the system.

In some situations it is desired to process data as rapidly as possible and accordingly the processing stages will be driven so as to advance their processing operations at as rapid a rate as possible until the slowest of the processing stages is unable to keep pace. In other situations, the power consumption of the integrated circuit is more important than the processing rate and the operating voltage of the integrated circuit will be reduced so as to reduce power consumption up to the point at which the slowest of the processing stages is again no longer able to keep pace.

One way of dealing with these limiting conditions is to drive the integrated circuit with processing clocks having a frequency known to be less than the minimum permissible by a tolerance range that takes account of worst case manufacturing variation between different integrated circuits, operating environment conditions, data dependencies of the signals being processed and the like. In the context of voltage level, it is normal to operate an integrated circuit at a voltage level which is sufficiently above a minimum voltage level to ensure that all processing stages will be able to keep pace taking account of worst case manufacturing variation, environmental conditions, data dependencies and the like. It will be appreciated that the conventional approach is cautious in restricting the maximum operating frequency and the minimum operating voltage to take account of the worst case situations.

In other known systems there are provided circuit elements which are intended to measure whether a particular integrated circuit is operating beyond its frequency or voltage requirements. Such known mechanisms include delay lines built into the integrated circuit along which the propagation of a signal can be monitored to ensure that it reaches the end of the delay line, or some other predetermined point within the delay line, at a time sufficient to ensure that the slowest processing stage on that integrated circuit will have completed its processing operation if the propagation along that delay line has also been satisfied. The delay line is designed to have a delay greater than the maximum delay of any processing stage by a sufficient margin to take account of worst case manufacturing variations, environment conditions, data dependencies or the like. Thus, this technique is also cautious in the way in which operating frequency and voltage are controlled.

SUMMARY OF THE INVENTION

Viewed from one aspect the present invention provides an integrated circuit for performing data processing, said integrated circuit comprising:

a plurality of processing stages, a processing stage output signal from at least one processing stage being supplied as a processing stage input signal to a following processing stage, wherein said at least one processing stage comprises:

processing logic operable to perform a processing operation upon at least one processing stage input value to generate a processing logic output signal;

a non-delayed latch operable to capture a non-delayed value of said processing logic output signal at a non-delayed capture time, said non-delayed value being supplied to said following processing stage as said processing stage output signal following said non-delayed capture time;

a delayed latch operable to capture a delayed value of said processing logic output signal at a delayed capture time later than said non-delayed capture time;

a comparator operable to compare said non-delayed value and said delayed value to detect a change in said processing logic output signal following said non-delayed capture time indicative of said processing logic not having finished said processing operation at said non-delayed capture time; and error-recovery logic operable when said comparator detects said change to perform an error-recovery operation suppressing use of said non-delayed value by said following processing stage.

The present technique recognizes that the operation of the processing stages themselves can be directly monitored to find the limiting conditions in which they fail. When actual failures occur, then these failures can be corrected for such that incorrect operation overall is not produced. The advantages achieved by the avoidance of excessively cautious performance margins in the previous approaches compared with the direct observation of the failure point in the present approach more than compensates for the additional time and power consumed in recovering the system when a failure does occur. Deliberately allowing such processing errors to occur such that critical paths fail to meet their timing requirements is highly counter-intuitive in this technical field where it is normal to take considerable efforts to ensure that all critical paths always do meet their timing requirements.

Having detected the occurrence of an error there are a variety of different ways in which this may be corrected or compensated. In one preferred type of embodiment the error-recovering logic is operable to replace the non-delayed value with the delayed value as the processing stage output signal. The replacement of the known defective processing stage output signal with the correct value taken from the delayed value sample is strongly preferred as it serves to ensure forward progress through the data processing operations even though errors are occurring and require compensation.

A preferred arrangement is one in which the error-recovery logic operates to force the delay value to be stored in the non-delay latch in place of the non-delayed value.

Whilst the present technique is applicable to both synchronous and asynchronous data processing circuits, the invention is well suited to synchronous data processing circuits in which the processing operations within the processing stages are driven by a non-delayed clock signal.

In the context of systems in which the processing stages are driven by the non-delayed clock signal, the error-recovery logic can utilize this to facilitate recovery from an error by gating the non-delayed clock signal to provide sufficient time for the following processing stage to recover from input of the incorrect non-delayed value and instead use the correct delayed value.

In the context of embodiments using a non-delayed clock signal, the capture times can be derived from predetermined phase points in the non-delayed clock signal and a delayed clock signal derived from the non-delayed clock signal. The delay between the non-delayed capture and the delayed capture can be defined by the phase shift between these two clock signals.

The present technique is particularly well suited to embodiments in which the processing stages are respective pipeline stages within a synchronous pipeline.

The detection and recovery from errors can be used in a variety of different situations, but is particularly well suited to situations in which it is wished to dynamically control operating parameters of an integrated circuit in dependence upon the detection of such errors. Counter intuitively, the present technique can be used to control operating parameters such that the system operates with a non-zero error rate being maintained as the target rate since this may correspond to an improved overall performance, either in terms of speed or power consumption, even taking into account the measures necessary to recover from occurrence of errors.

The operating parameters which may be varied include the operating voltage, an operating frequency an integrated circuit body biased voltage (which controls threshold levels) and temperature amongst others.

In order to ensure that the data captured in the delayed latch is always correct, an upper limit on the maximum delay in the processing logic of any stage is such that at no operating point can the delay of the processing logic of any stage exceed the sum of the clock period plus the amount by which the delayed capture is delayed. As a lower limit on any processing delay there is a requirement that the processing logic of any stage should have a processing time exceeding the time by which the delayed capture follows the non-delayed capture so as to ensure that following data propagated along short paths does not inappropriately corrupt the delayed capture value. This can be ensured by padding short paths with one or more delay elements as required.

The present technique is applicable to a wide variety of different types of integrated circuit, such as general digital processing circuits, but is particularly well suited to systems in which the processing stages are part of a data processor or microprocessor.

In order to facilitate the use of control algorithms for controlling the operational parameters preferred embodiments include an error counter circuit operable to store a count of the detection of errors corresponding to a change in the delayed value compared with the non-delayed value. This error counter may be reached by software to carry out control of the operational parameters.

It will be appreciated that the delayed latch and non-delayed latch discussed above could have a wide variety of different forms. In particular, these may be considered to include embodiments in the form of flip-flops, D-type latches, sequential elements, memory cells, register elements, combinations thereof and a wide variety of other storage devices which are able to store a signal value.

Viewed from another aspect the present invention provides a method of controlling an integrated circuit for performing data processing, said method comprising the steps of:

supplying a processing stage output signal from at least one processing stage of a plurality of processing stages as a processing stage input signal to a following processing stage, said at least one processing stage operating to:

perform a processing operation with data processing logic upon at least one processing stage input value to generate a processing logic output signal;

capture a non-delayed value of said processing logic output signal at a non-delayed capture time, said non-delayed value being supplied to said following processing stage as said processing stage output signal following said non-delayed capture time;

capturing a delayed value of said processing logic output signal at a delayed capture time later than said non-delayed capture time;

comparing said non-delayed value and said delayed value to detect a change in said processing logic output signal following said non-delayed capture time indicative of said processing logic not having finished said processing operation at said non-delayed capture time; and when said change is detected, performing an error-recovery operation suppressing use of said non-delayed value by said following processing stage.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
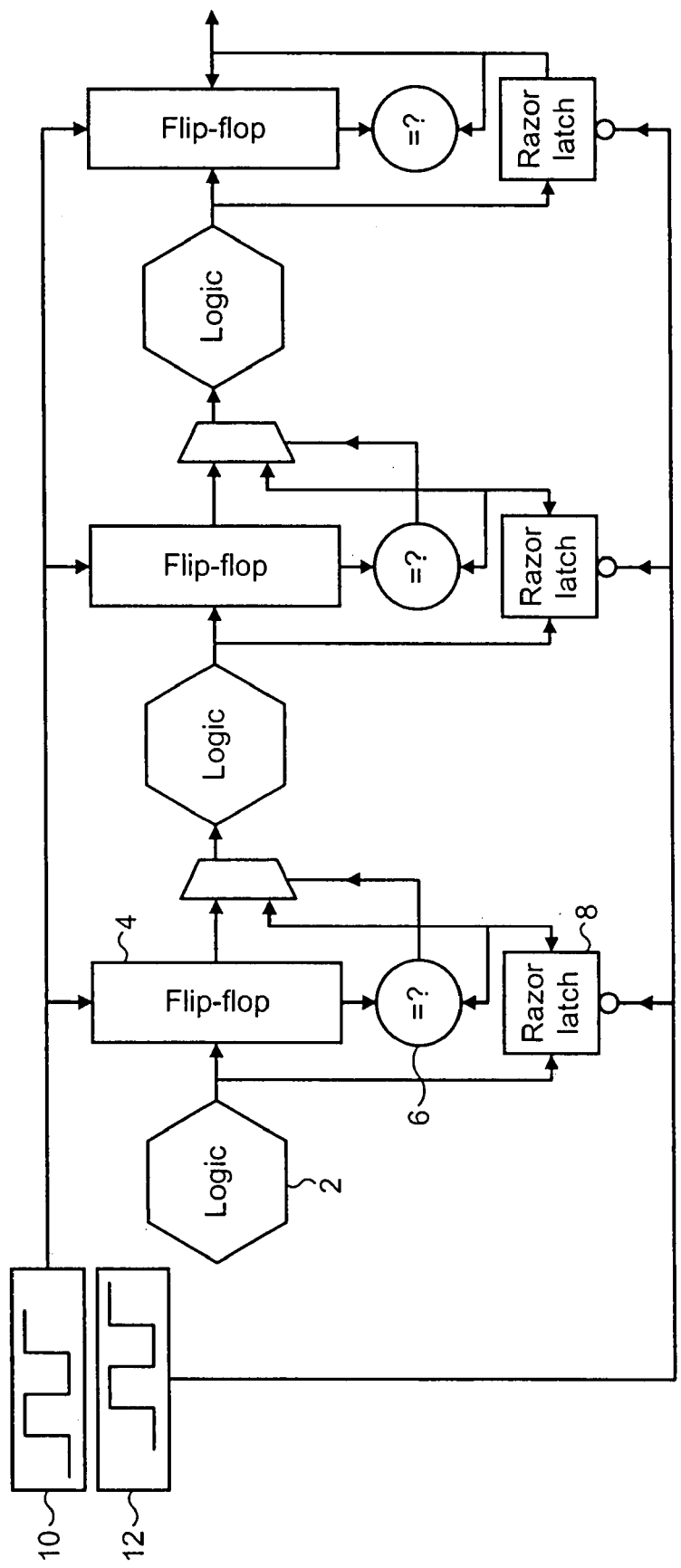
FIG. 1 schematically illustrates a plurality of processing stages to which the present technique is applied.

FIG. 1 illustrates a part of an integrated circuit, which may be a part of a synchronous pipeline within a processor core, such as an ARM processor core produced by ARM limited of Cambridge, England. The synchronous pipeline is formed of a plurality of like processing stages. The first stage comprises processing logic 2 followed by a non-delayed latch 4 in the form of a flip-flop together with a comparator 6 and a delayed latch 8. Subsequent processing stages are similarly formed. A non-delayed clock signal 10 drives the processing logic and non-delayed latches 4 within all of the processing stages to operate synchronously as part of a synchronous pipeline. A delayed clock signal 12 is supplied to the delayed latches 8 of the respective processing stages. The delayed clock signal 12 is a phase shifted version of the non-delayed clock signal 10. The degree of phase shift controls the delay period between the capture of the output of the processing logic 2 by the non-delayed latch 4 and the capture of the output of the processing logic 2 at a later time performed by the delayed latch 8. If the processing logic 2 is operating within limits given the existing non-delayed clock signal frequency, the operating voltage being supplied to the integrated circuit, the body biased voltage, the temperature etc, then the processing logic 2 will have finished its processing operations by the time that the non-delayed latch 4 is triggered to capture its value. Consequently, when the delayed latch 8 later captures the output of the processing logic 2, this will have the same value as the value captured within the non-delayed latch 4. Accordingly, the comparator 6 will detect no change occurring during the delay period and error-recovery operation will not be triggered. Conversely, if the operating parameters for the integrated circuit are such that the processing logic 2 has not completed its processing operation by the time that the non-delayed latch 4 captures its value, then the delayed latch 8 will capture a different value and this will be detected by the comparator 6 thereby forcing an error-recovery operation to be performed. It will be seen that the error-recovery operation could be to replace the output of the non-delayed latch 4 which was being supplied to the following processing stage during the time following its capture with the delayed value stored within the delayed latch 8. This delayed value may additionally be forced to be stored within the non-delayed latch 4 replacing the previously erroneously captured value stored therein.

A meta-stability detector 7 serves to detect meta-stability in the output of the non-delayed latch 4, i.e. not at a clearly defined logic state. If such meta-stability is detected, then this is treated as an error and the value of the delay latch 6 is used instead.

On detection of an error, the whole pipeline may be stalled by gating the non-delayed clock signal 10 for an additional delayed period to give sufficient time for the processing logic in the following processing stage to properly respond to the corrected input signal value being supplied to it. Alternatively, it is possible that upstream processing stages may be stalled with subsequent processing stages being allowed to continue operation with a bubble inserted into the pipeline in accordance with standard pipeline processing techniques using a counterflow architecture (see the bubble and flush latches of FIG. 2). Another alternative is that the entire processing pipeline may be reset with the delayed latch values being forced into the non-delayed latches of each stage and processing resumed. The re-use of the delayed latch value in place of the erroneous value rather than an attempted recalculation ensures that forward progress is made through the processing operations even though an error has occurred.

There are constraints relating to the relationship between the processing time taken by the processing logic within the processing stages and the delay between the non-delayed capture time and the delayed capture time. In particular, the minimum processing time of any processing stage should not be less than the delay in order to ensure that the delayed value captured is not corrupted by new data being outputted from a short delay processing stage. It may be necessary to pad short delay processing stages with extra delay elements to ensure that they do not fall below this minimum processing time. At the other extreme, it needs to be ensured that the maximum processing delay of the processing logic within a processing stage that can occur at any operational point for any operating parameters is not greater than the sum of the normal non-delayed operating clock period and the delay value such that the delay value captured in the delay value latch is ensured to be stable and correct.

An error counter circuit (not illustrated) is provided to count the number of non-equal detections may be the comparator 6. This count of errors detected and recovered from can be used to control the operating parameters using either hardware implemented or software implemented algorithms. The counter is readable by the software. The best overall performance, whether in terms of maximum speed or lowest power consumption can be achieved by deliberately operating the integrated circuit with parameters that maintain a non-zero level of errors. The gain from operating non-cautious operating parameters in such circumstances exceeds the penalty incurred by the need to recover from errors.

Figure 2:
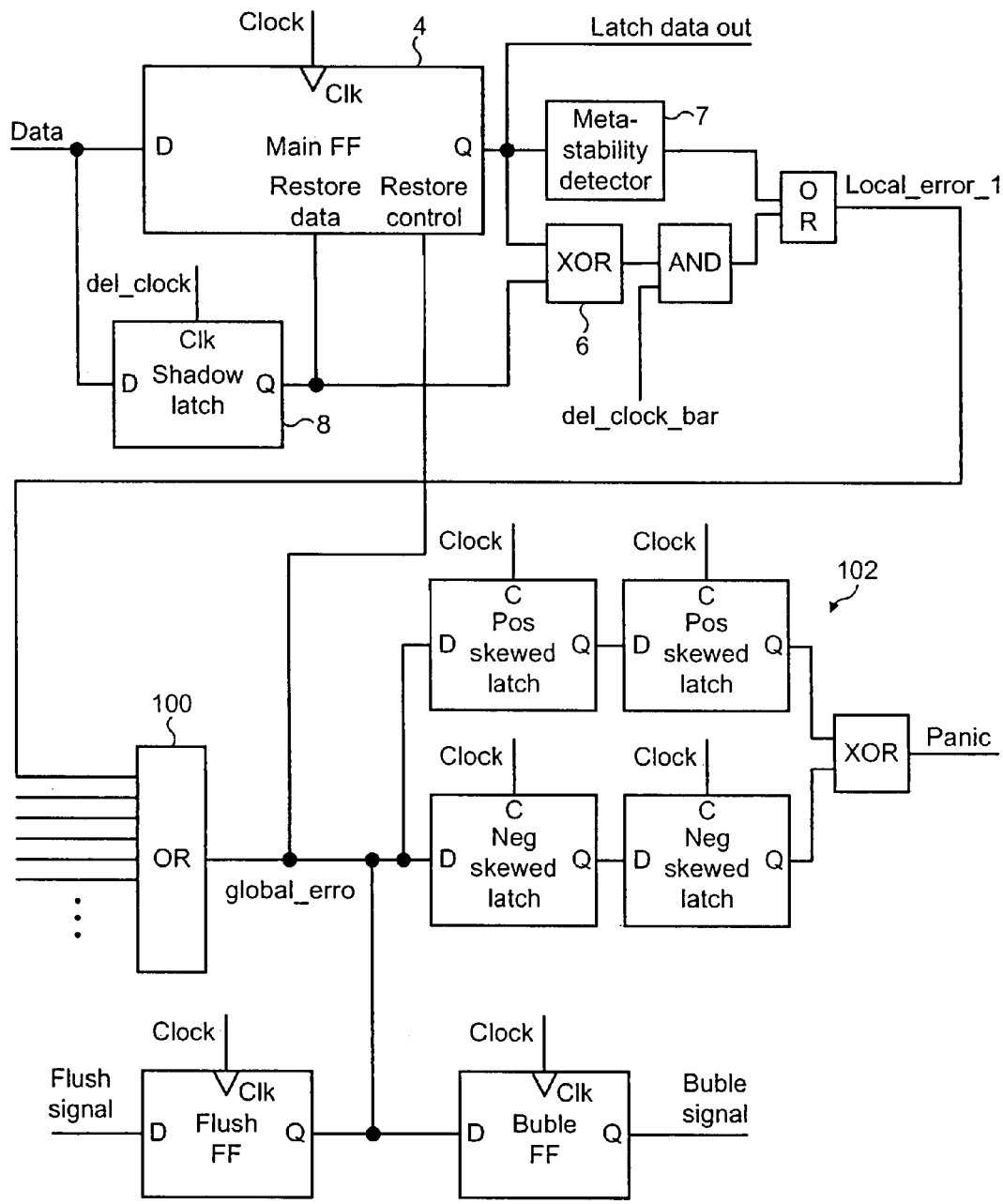
FIG. 2 is a circuit block diagram schematically illustrating a circuit for use in the present technique.

FIG. 2 is a circuit block diagram schematically illustrating a circuit for use in the present technique. The top portion of FIG. 2 illustrates circuit elements provided within each processing stage, namely the non-delayed latch 4, the delayed latch 8 and the comparator 6. A meta-stability detector 7 serves to detect meta-stability in the output of the non-delayed latch 4 and this also triggers generation of an error signal. Error signals from a plurality of such stages are supplied to respective inputs of an OR gate 100 where a global error signal is generated if an error is detected in any processor stage. The global error signal can be used to trigger flush and bubble insertion signals as illustrated. The circuits 102 detect whether the error signal itself is meta-stable. The error signal is latched with a positively skew latch, referencing at a higher voltage and a neg skewed latch, referencing at a lower voltage. If the two disagree in their latched value, this indicates that the error signal was meta-stable and the panic signal is pulled. By latching the error signal and waiting for an entire clock cycle before it sampled (i.e. two latches in series), the probability of the panic signal being meta-stable is negligible. It is significant that if the panic signal is pulled, then the restroed value from the delayed latch could be corrupted due to the meta-stability of the error signal. In this case, the instruction is also invalidated and there is no forward progress. Hence flush the pipeline restart the instruction and lower the clock frequency to ensure that the error signal will not be meta-stable on the retry of the same instruction (which could otherwise cause an infinite loop of retries).

Figure 3:
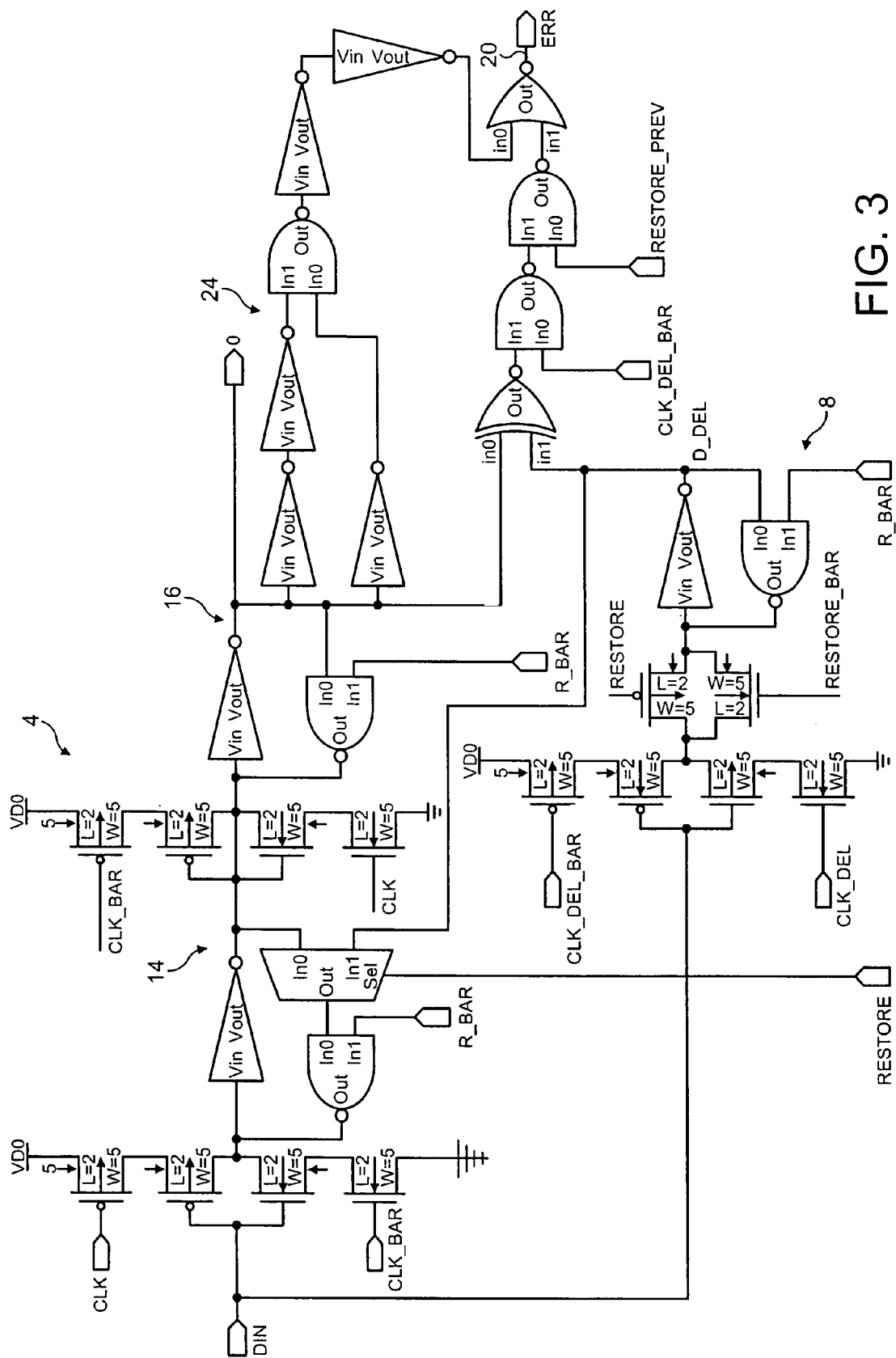
FIG. 3 is a circuit diagram schematically illustrating a non-delayed latch and a delayed latch together with an associated comparator and error-recovery logic.

FIG. 3 is a circuit illustrating in more detail the non-delayed latch, the delayed latch, the comparator and at least part of the error-recovery circuitry. The non-delayed latch 4 can be seen to be in the form of a flip-flop provided by the two latches 14, 16. The delayed latch 8 is in the form of a single feedback element. An XOR gate 18 serves as the comparator. An error signal 20 emerges from the circuit of FIG. 3 and may be supplied to the error counter circuit as previously discussed or to other operational parameter adjusting circuits or systems. The error signal 20 serves to switch a multiplexer 22 that forces the delayed value stored within the delayed latch 8 to be stored within the latch 14 of the non-delayed latch 4. meta-stability detecting circuits 24 serve to detect the occurrence of meta-stability within the non-delayed latch 4 and also use this to trigger an error signal which will cause the erroneous meta-stable value to be replaced by the delayed value stored within the delayed latch 8.

Figure 4A:
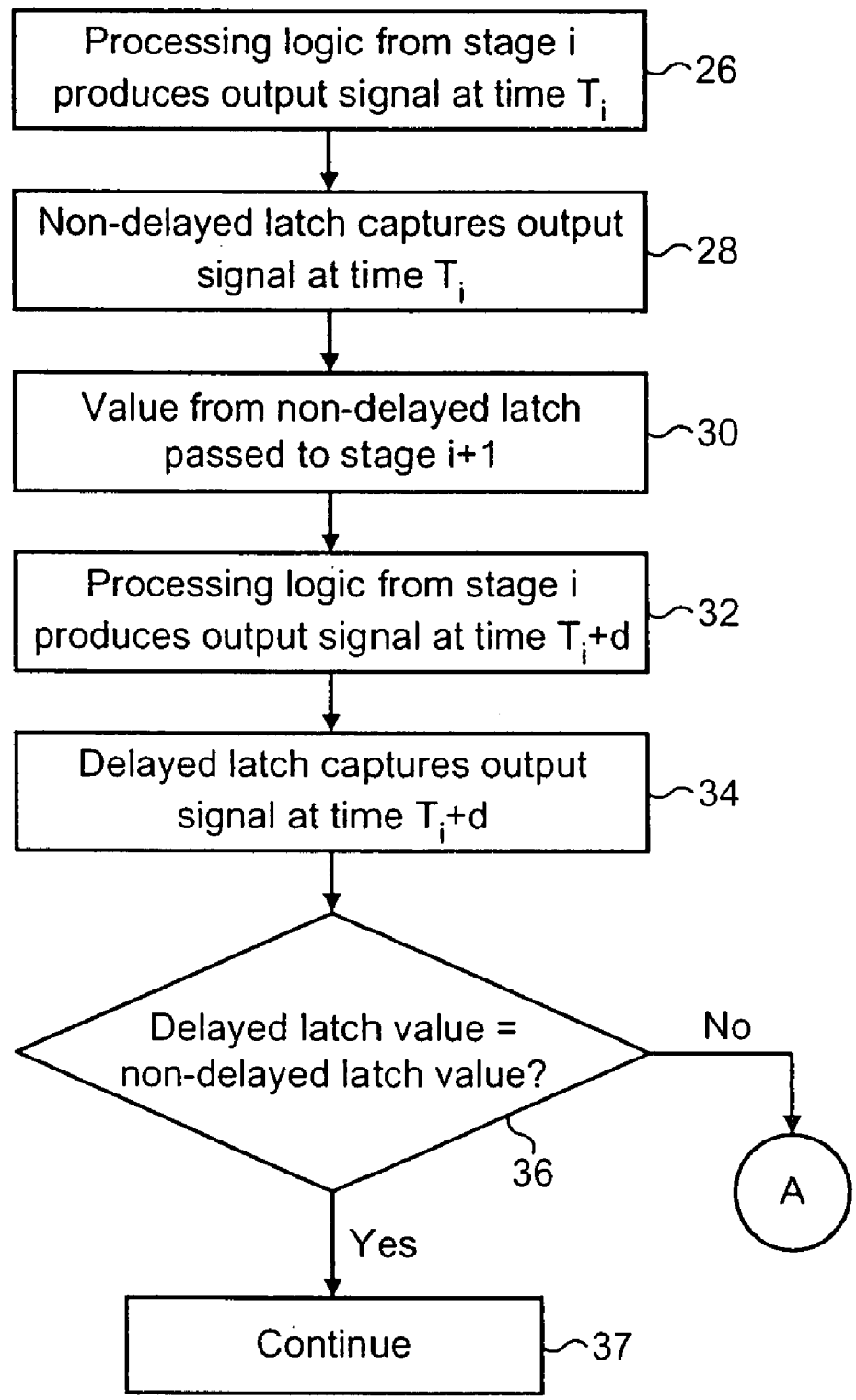
FIGS. 4A and 4B are a flow diagram schematically illustrating the operation of the circuit of FIG. 1.
Figure 4B:
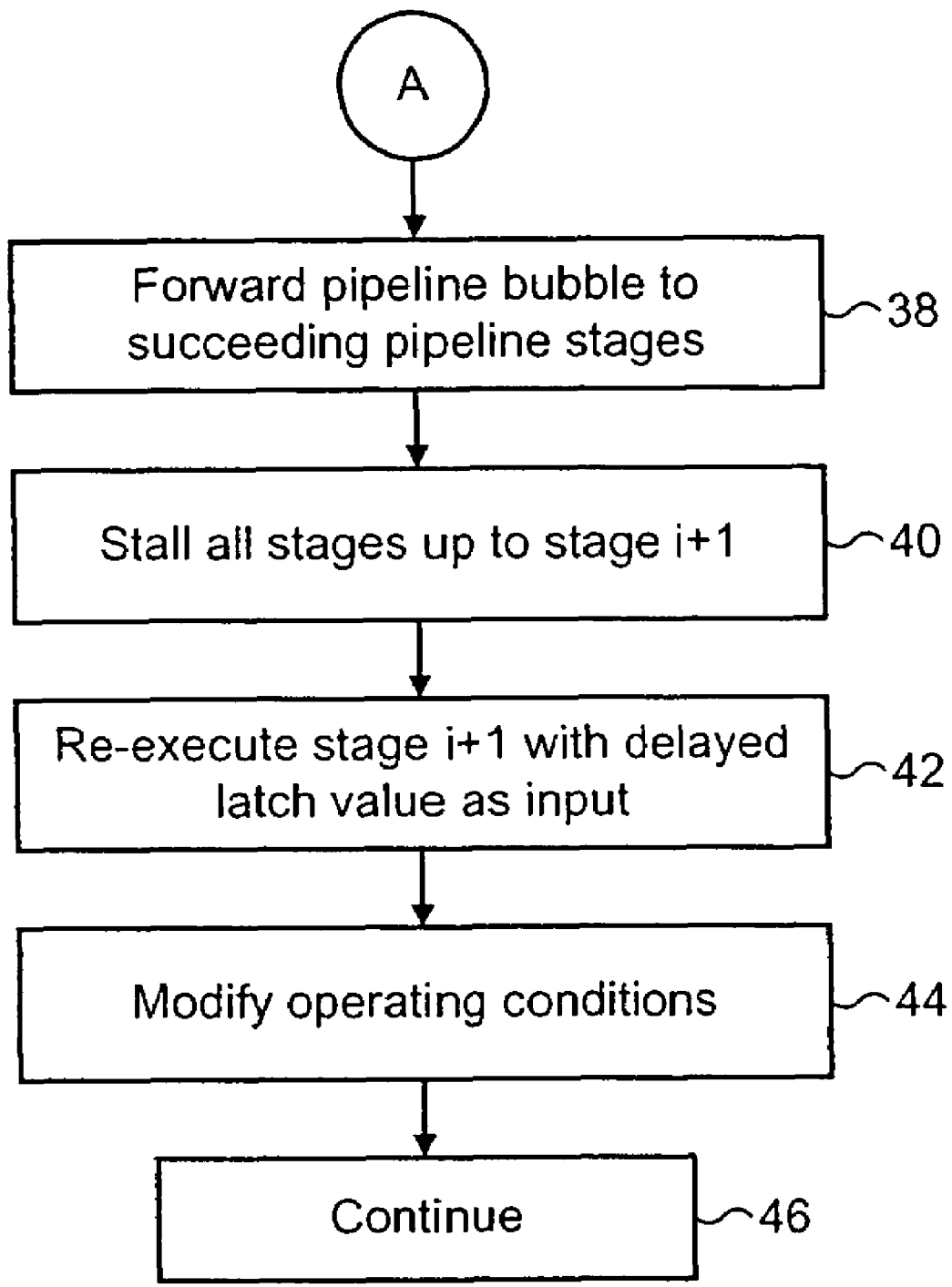

FIGS. 4A and 4B are a flow diagram schematically illustrating the operation of the circuits of FIGS. 1, 2 and 3.

At step 26 the processing logic from a stage i produces its output signal at a time $T_i$. At step 28 this is captured by the non-delayed latch and forms the non-delayed value. At step 30 the non-delayed value from the non-delayed latch starts to be passed to the following processing stage i+1 which commences processing based upon this value. This processing may turn out to be erroneous and will need recovering from should an error be detected.

Step 32 allows the processing logic to continue processing for a further time period, the delay time, to produce an output signal at time Ti+d. This output signal is latched in the delayed latch at step 34. The values within the delayed latch and the non-delayed latch are compared at step 36. If they are equal then no error has occurred and normal processing continues at step 37. If they are not equal, then this indicates that the processing logic at time $T_i$ had not completed its processing operations when the non-delayed latch captured its value and started to supply that value to the subsequent processing stage i+1. Thus, an error condition has arisen and will require correction. At step 38 this correction is started by the forwarding of a pipeline bubble into the pipeline stages following stage i. At step 40 the preceding stages to stage i+1 are all stalled. This includes the stage i at which the error occurred. At step 42, stage i+1 re-executes its operation using the delayed latch value as its input. At step 44 the operating parameters of the integrated circuit may be modified as required. As an example, the operating frequency may be reduced, the operating voltage increased, the body biased voltage increased etc. Processing then continues to step 46.

If an insufficient number of errors is detected, then the operating parameter controlling circuits and algorithms can deliberately adjust the operating parameters so as to improve performance and provoke a non-zero error rate.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. An integrated circuit for performing data processing, said integrated circuit comprising:
   an error detector responsive to errors in operation of said integrated circuit to general an error signal;
   error-repair logic responsive to said error signal to repair said errors in operation; and
   circuitry configured to receive said error signal from said error detector and a clock signal and to synchronize said error signal with said clock signal to generate a further error signal.

2. An integrated circuit as claimed in claim 1, further comprising:
   an operational parameter controller operable to control one or more performance controlling operational parameters of said integrated circuit; wherein
   said operational parameter controller dynamically controls at least one of said one or more performance controlling parameters in dependence upon one or more characteristics of errors detected by said error detector to maintain a non-zero rate of errors in operation, said errors in operation being repaired by said error repair logic such that data processing by said integrated circuit continues.

3. An integrated circuit as claimed in claim 2, wherein said operational parameter controller applies feedback control to adjust said at least one of said one or more performance controlling parameters in dependence upon said one or more characteristics of errors detected by said error detector.

4. An integrated circuit as claimed in claim 2, wherein said one or more characteristics of errors detected by said error detector comprise at least one of:
   an error rate of said errors detected by said error detector; and
   a reduction in processing performance resulting from repair by said error-repair logic of said errors detected by said error detector.

5. An integrated circuit as claimed in claim 2, wherein said one or more performance controlling parameters include at least one of:
   an operating voltage;
   an operating frequency;
   an integrated circuit body bias voltage; and
   temperature.

6. An integrated circuit as claimed in claim 1, wherein said errors detector detects errors by double-sampling data signal values within said integrated circuit, a difference between sampled values being indicative of an error.

7. An integrated circuit as claimed in claim 6, wherein said double-sampling is detecting a signal value at a sampling point at respective different times.

8. An integrated circuit as claimed in claim 1 comprising:
   a plurality of processing stages, a processing stage output signal from at least one processing stage being supplied as a processing stage input signal to a following processing stage, wherein said at least one processing stage comprises:
   processing logic operable to perform a processing operation upon at least one processing stage input value to generate a processing logic output signal;
   a non-delayed latch operable to capture a non-delayed value of said processing logic output signal at a non-delayed capture time, said non-delayed value being supplied to said following processing stage as said processing stage output signal following said non-delayed capture time; and
   a delayed latch operable to capture a delayed value of said processing logic output signal at a delayed capture time later than said non-delayed capture time; wherein
   said error detector comprises a comparator operable to compare said non-delayed value and said delayed value to detect a change in said processing logic output signal following said non-delayed capture time indicative of said processing logic not having finished said processing operation at said non-delayed capture time; and
   said error-repair logic is operable when said comparator detects said change to perform an error-repair operation suppressing use of said non-delayed value by said following processing stage.

9. An integrated circuit as claimed in claim 8, comprising a meta-stability detector operable to detect meta-stability in said non-delayed value and trigger said error-repair logic to suppress use of said non-delayed value if found to be meta-stable.

10. An integrated circuit as claimed in claim 8, wherein when said comparator detects said change, said error-repair logic is operable to replace said non-delayed value with said delayed value as said processing stage output signal.

11. An integrated circuit as claimed in claim 10, wherein supply of said delayed value to said following processing stage forces forward progress through processing operations.

12. An integrated circuit as claimed in claim 8, wherein when said comparator detects said change said error-repair logic is operable to force said delayed value to be stored in said non-delayed latch in place of said non-delayed value.

13. An integrated circuit as claimed in claim 8, wherein processing operations within said processing stage and said following processing stage are driven by a non-delayed clock signal.

14. An integrated circuit as claimed in claim 13, wherein when said comparator detects said change said error-repair logic is operable to gate said non-delayed clock signal to provide time for said following processing stage to recover from input of said non-delayed value and instead use said delayed value.

15. An integrated circuit as claimed in claim 14, wherein said non-delayed capture time is derived from a predetermined phase point of said non-delayed clock signal, a phased delayed version of said non-delayed clock signal is used as a delayed clock signal and said delayed capture time is derived from a predetermined phase point of said delayed clock signal.

16. An integrated circuit as claimed in claim 8, wherein said plurality of processing stages are respective pipeline stages within a synchronous pipeline.

17. An integrated circuit as claimed in claim 8, wherein a minimum processing time taken for said processing operation is greater than a time separating said delayed capture time from said non-delayed capture time such that said delayed value is not influenced by a processing operation performed upon different input values.

18. An integrated circuit as claimed in claim 17, wherein said processing logic includes one or more delay elements to ensure said minimum processing time is exceeded.

19. An integrated circuit as claimed in claim 8, wherein a maximum processing time taken for said processing operation is less than a sum of a time separating said delayed capture time from said non-delayed capture time and a time between non-delayed capture times such that said processing logic will have completed said processing operation by said delayed capture time.

20. An integrated circuit as claimed in claim 8, wherein said processing stages are part of a data processor.

21. An integrated circuit as claimed in claim 8, comprising an error counter circuit operable to store a count of detection of errors corresponding to said change.

22. An integrated circuit as claimed in claim 21, wherein said count may be read by software.

23. An integrated circuit as claimed in claim 8, wherein, when said comparator detects said change, said error-repair logic is operable to control said processing logic to recalculate said processing logic output signal.

24. A method of controlling an integrated circuit for performing data processing, said method comprising the steps of:
    detecting errors in operation of said integrated circuit to generate an error signal;
    repairing detected errors in operation in response to said error signal; and
    synchronizing said error signal with a clock signal to generate a further error signal.

25. A method as claimed in claim 22, further comprising the steps of:
    controlling one or more performance controlling operational parameters of said integrated circuit; wherein
    at least one of said one or more performance controlling parameters is controlled in dependence upon one or more characteristics of detected error to maintain a non-zero rate of errors in operation, said errors in operation being repaired such that data processing by said integrated circuit continues.

26. A method as claimed in claim 25, wherein said step of controlling applies feedback control to adjust said at least one of said one or more performance controlling parameters in dependence upon said one or more characteristics of detected errors.

27. A method as claimed in claim 25, wherein said one or more characteristics of detected errors comprise at least one of:
    an error rate of detected errors; and
    a reduction in processing performance resulting from repair of detected errors.

28. An integrated circuit as claimed in claim 25, wherein said one or more performance controlling parameters include at least one of:
    an operating voltage;
    an operating frequency;
    an integrated circuit body bias voltage; and
    temperature.

29. A method as claimed in claim 24, wherein said step of detecting errors detects errors by double-sampling data signal values within said integrated circuit, a difference between sampled values being indicative of an error.

30. A method as claimed in claim 29, wherein said double-sampling is detecting a signal value at a sampling point at respective different times.

31. A method as claimed in claim 24, comprising the steps of:
    supplying a processing stage output signal from at least one processing stage of a plurality of processing stages as a processing stage input signal to a following processing stage, said at least one processing stage operating to:
    perform a processing operation with data processing logic upon at least one processing stage input value to generate a processing logic output signal;
    capture a non-delayed value of said processing logic output signal at a non-delayed capture time, said non-delayed value being supplied to said following processing stage as said processing stage output signal following said non-delayed capture time; and
    capture a delayed value of said processing logic output signal at a delayed capture time later than said non-delayed capture time; wherein
    detecting errors comprises comparing said non-delayed value and said delayed value to detect a change in said processing logic output signal following said non-delayed capture time indicative of said processing logic not having finished said processing operation at said non-delayed capture time; and
    said step of repairing detected errors comprises suppressing use of said non-delayed value by said following processing stage.

32. A method as claimed in claim 31, comprising detection meta-stability in said non-delayed value and triggering suppression of use of said non-delayed value if found to be meta-stable.

33. A method as claimed in claim 31, wherein when said change is detected, replacing said non-delayed value with said delayed value as said processing stage output signal.

34. A method as claimed in claim 31, wherein supply of said delayed value to said following processing stage forces forward progress through processing operations.

35. A method as claimed in claim 31, wherein when said change is detected, forcing said delayed value to be stored in place of said non-delayed value.

36. A method as claimed in claim 31, wherein processing operations within said processing stage and said following processing stage are driven by a non-delayed clock signal.

37. A method as claimed in claim 36, wherein when a change is detected at said comparing step said error-repair operation comprises gating said non-delayed clock signal to provide time for said following processing stage to recover from input of said non-delayed value and instead use said delayed value.

38. A method as claimed in claim 36, wherein said non-delayed capture time is derived from a predetermined phase point of said non-delayed clock signal, a phase delayed version of said non-delayed clock signal is used as a delayed clock signal and said delayed capture time is derived from a predetermined phase point of said delayed clock signal.

39. A method as claimed in claim 31, wherein said plurality of processing stages are respective pipeline stages within a synchronous pipeline.

40. A method as claimed in claim 31, wherein a minimum processing time taken for said processing operation is greater than a time separating said delayed capture time from said non-delayed capture time such that said delayed value is not influenced by a processing operation performed upon different input values.

41. A method as claimed in claim 40, wherein said processing logic includes one or more delay elements to ensure said minimum processing time is exceeded.

42. A method as claimed in claim 31, wherein a maximum processing time taken for said processing operation is less than a sum of a time separating said delayed capture time from said non-delayed capture time and a time between non-delayed capture times such that said processing logic will have completed said processing operation by said delayed capture time.

43. A method as claimed in claim 31, wherein said processing stages are part of a data processor.

44. A method as claimed in claim 31, comprising the step of storing a count of detection of errors corresponding to said change.

45. A method as claimed in claim 44, wherein said count may be read by software.

46. A method as claimed in claim 31, wherein when said change is detected, said processing logic is controlled to recalculate said processing logic output signal.

* * * * *